(12) United States Patent
Wu et al.

(10) Patent No.: US 8,900,999 B1
(45) Date of Patent: Dec. 2, 2014

(54) LOW TEMPERATURE HIGH PRESSURE HIGH $H_2/WF_6$ RATIO W PROCESS FOR 3D NAND APPLICATION

(71) Applicant: Applied Materials, Inc., Santa Clara, CA (US)

(72) Inventors: Kai Wu, Palo Alto, CA (US);
Sang-Hyeob Lee, Fremont, CA (US);
Joshua Collins, Sunnyvale, CA (US);
Kiejin Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/036,157

(22) Filed: Sep. 25, 2013

Related U.S. Application Data

(60) Provisional application No. 61/866,649, filed on Aug. 16, 2013.

(51) Int. Cl.
*H01L 21/44* (2006.01)
*H01L 21/02* (2006.01)

(52) U.S. Cl.
CPC .... *H01L 21/02175* (2013.01); *H01L 21/02263* (2013.01)
USPC .............. 438/685; 257/E21.17; 257/E21.295; 257/E21.476; 257/E21.582

(58) Field of Classification Search
USPC ..................... 257/E21.17, E21.295, E21.476, 257/E21.582; 438/656, 680, 685
See application file for complete search history.

(56) References Cited

U.S. PATENT DOCUMENTS

| | | | |
|---|---|---|---|
| 5,028,565 A | 7/1991 | Chang et al. | |
| 5,906,866 A | 5/1999 | Webb | |
| 6,156,382 A | 12/2000 | Rajagopalan et al. | |
| 8,071,478 B2 | 12/2011 | Wu et al. | |
| 2011/0244682 A1* | 10/2011 | Khandelwal et al. | ......... 438/680 |

OTHER PUBLICATIONS

EE Times Connecting the Global Electronics Community; News & Analysis; Applied says tungsten CVD system's dual-pressure process can improve yields; 4 pages; May 30, 2000.

\* cited by examiner

*Primary Examiner* — Asok K Sarkar
(74) *Attorney, Agent, or Firm* — Patterson & Sheridan, LLP

(57) ABSTRACT

A method of filling a feature in a substrate with tungsten without forming a seam is presented. The tungsten is deposited by a thermal chemical vapor deposition (CVD) process using hydrogen ($H_2$) and tungsten hexafluoride ($WF_6$) precursor gases. The $H_2$ to $WF_6$ flow rate ratio is greater than 40 to 1, such as from 40 to 1 to 100 to 1. The substrate temperature during deposition is less than 300 degrees Celsius (° C.) and the processing pressure during deposition is greater than 300 Torr.

15 Claims, 4 Drawing Sheets

LOW TEMPERATURE HIGH PRESSURE HIGH H$_2$/WF$_6$ RATIO W PROCESS FOR 3D NAND APPLICATION

CROSS-REFERENCE TO RELATED APPLICATIONS

This application claims benefit of U.S. Provisional Patent Application Ser. No. 61/866,649, filed Aug. 16, 2013, which is herein incorporated by reference.

BACKGROUND

1. Field

Embodiments of the invention generally relate to the processing of substrates, and more particularly relate to methods for forming tungsten materials on substrates using vapor deposition processes.

2. Description of the Related Art

For over 50 years, the number of transistors formed on an integrated circuit has doubled approximately every two years. This two-year-doubling trend, also known as Moore's Law, is projected to continue, with devices formed on semiconductor chips shrinking from the current critical dimension of 20-30 nm to below 100 Angstroms in future fabrication processes currently being designed. As device geometries shrink, substrate sizes also grow. As the 300 mm wafer replaced the 200 mm wafer years ago, the 300 mm wafer may be replaced by the 400 mm or 450 mm wafer.

As device dimensions continue to shrink, and the two-dimensional limitations of Moore's Law become insurmountable, manufacturers are turning to three-dimensional structures to propel future growth. Devices such as FinFETs and three-dimensional memory devices such as DRAM devices typically feature layers of different materials in a stack. Multiple devices or cells may be stacked one atop the other, and several devices are typically formed on one substrate. The layers are often different materials, so one structure may contain alternating layers of insulating, semiconducting, and metallic layers such as SiO$_2$, SiN, a-Si, and poly-Si. Typically the stack consists of 32 or 64, or even 128 layers of these alternating layers.

Tungsten has been used at contact level in logic application for about two decades. In recent advanced CMOS devices, new technology such as metal gate and FinFET emerge, which leads to a new application for tungsten as metal gate fill for both PMOS and NMOS devices. In 3D NAND devices, tungsten is also used for metal gate fill. The requirement for tungsten fill becomes more and more challenging. For contact, the overhang becomes more challenging as the dimensions of contacts are getting smaller and typically leaves a big seam after tungsten conformal fill. Furthermore, the seam will be exposed to slurry during tungsten CMP, which causes integration issues. For metal gate trench in both advanced CMOS and 3D NAND, traditional tungsten conformal growth inevitably leaves a seam in the middle. In addition, the surface area of the trench or via of 3D NAND structure is significantly larger than the surface area of standard via/trench. Thus, fast deposition rate and insufficient reactant supply may lead to inconsistent thickness of the tungsten fill between high density and low density pattern areas. Therefore, an improved method of forming tungsten fill is required for both contact and metal gate fill in the advanced logic and memory devices.

SUMMARY

Embodiments of the present invention generally relate to methods of forming a tungsten film on a substrate without forming a seam in features that are filled with the tungsten film. The tungsten film is formed by a thermal chemical vapor deposition (CVD) process using a reducing gas and a tungsten precursor, such as hydrogen (H$_2$) and tungsten hexafluoride (WF$_6$). The H$_2$ to WF$_6$ flow rate ratio is greater than 40 to 1, such as from 40 to 1 to 100 to 1. The substrate temperature during processing is less than 300 degrees Celsius (° C.) and the processing pressure is greater than 300 Torr.

In one embodiment, a method for depositing a tungsten film on a substrate is disclosed. The method includes positioning a substrate in a substrate process chamber, wherein the substrate has a feature formed therein. The method further includes depositing the tungsten film inside the feature without forming a seam by flowing a reducing gas and a tungsten containing gas into the process chamber, wherein the flow ratio of the reducing gas to the tungsten containing gas is greater than 40 to 1. The substrate is heated to a temperature that is less than 300 degrees Celsius, and the processing pressure is greater than 300 Torr during the depositing of the tungsten film.

In another embodiment, a method for depositing a tungsten film on a substrate is disclosed. The method includes positioning a substrate in a substrate process chamber, wherein the substrate has a feature formed therein. The method further includes depositing the tungsten film inside the feature without forming a seam by flowing a hydrogen gas and a tungsten hexafluoride gas into the process chamber, wherein the flow ratio of the reducing gas to the tungsten containing gas is greater than 40 to 1. The substrate is heated to a temperature that is less than 300 degrees Celsius, and the processing pressure is greater than 300 Torr during the depositing of the tungsten film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods of forming a tungsten film on a substrate without forming a seam in features filled with tungsten. The tungsten film is formed by a thermal chemical vapor deposition (CVD)

process using hydrogen (H$_2$) and tungsten hexafluoride (WF$_6$) precursor gases. The H$_2$ to WF$_6$ flow rate ratio is greater than 40 to 1, such as from 40 to 1 to 100 to 1. The CVD processing temperature is less than 300 degrees Celsius (° C.) and the processing pressure is greater than 300 Torr.

Figure 1:
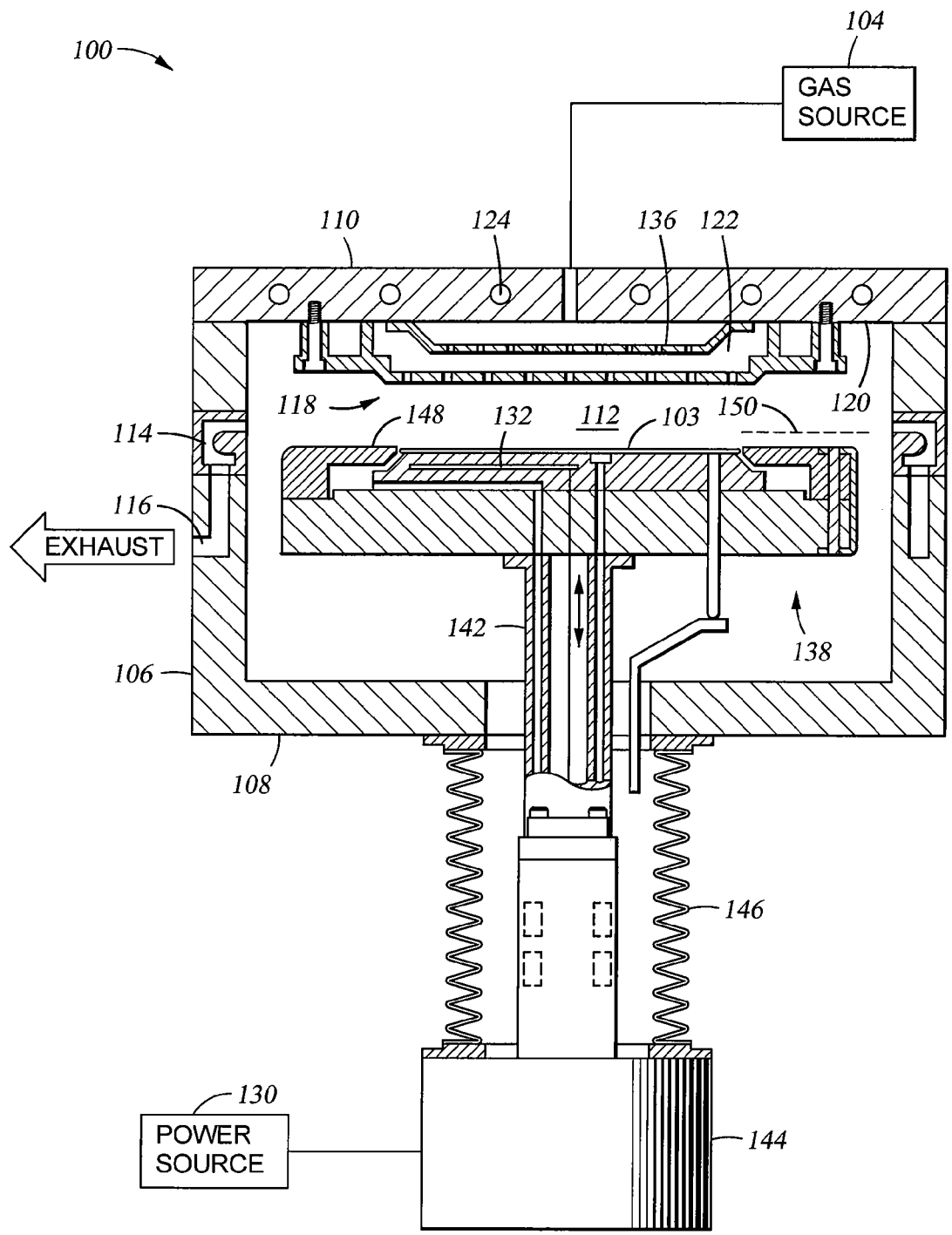
FIG. 1 is a cross sectional view of a process chamber that may be used for depositing a tungsten layer according to one embodiment of the invention.

FIG. 1 is a schematic cross sectional view of a CVD process chamber 100 that may be used for depositing a tungsten layer according to the embodiments described herein. Such a process chamber 100 is available from Applied Materials, Inc. of Santa Clara, Calif. An integrated processing system capable of performing the tungsten layer deposition methods described herein is the Centura® tungsten CVD chamber, available from Applied Materials, Inc. of Santa Clara, Calif. It is to be understood that the chamber described below is an exemplary embodiment and other chambers, including chambers from other manufacturers may be used with or modified to match embodiments of this invention without diverging from the inventive characteristics described herein.

The process chamber 100 includes walls 106, a bottom 108, and a lid 110 that define a process volume 112. The walls 106 and bottom 108 are typically fabricated from a unitary block of aluminum. The walls 106 may have conduits (not shown) therein through which a fluid may be passed to control the temperature of the walls 106. The process chamber 100 may also include a pumping ring 114 that couples the process volume 112 to an exhaust port 116 as well as other pumping components (not shown).

A substrate support assembly 138, which may be heated, may be centrally disposed within the process chamber 100. The substrate support assembly 138 supports a substrate 103 during a deposition process. The substrate support assembly 138 generally is fabricated from aluminum, ceramic or a combination of aluminum and ceramic and typically includes a vacuum port (not shown) and at least one or more heating elements 132.

The vacuum port may be used to apply a vacuum between the substrate 103 and the substrate support assembly 138 to secure the substrate 103 to the substrate support assembly 138 during the deposition process. The one or more heating elements 132, may be, for example, electrodes disposed in the substrate support assembly 138, and coupled to a power source 130, to heat the substrate support assembly 138 and substrate 103 positioned thereon to a predetermined temperature.

Generally, the substrate support assembly 138 is coupled to a stem 142. The stem 142 provides a conduit for electrical leads, vacuum and gas supply lines between the substrate support assembly 138 and other components of the process chamber 100. Additionally, the stem 142 couples the substrate support assembly 138 to a lift system 144 that moves the substrate support assembly 138 between an elevated position 150, and a lowered position, as shown in FIG. 1. Bellows 146 provide a vacuum seal between the process volume 112 and the atmosphere outside the chamber 100 while facilitating the movement of the substrate support assembly 138.

The substrate support assembly 138 additionally supports a circumscribing shadow ring 148. The shadow ring 148 is annular in form and may comprise a ceramic material such as, for example, aluminum nitride. Generally, the shadow ring 148 prevents deposition at the edge of the substrate 103 and substrate support assembly 138.

The lid 110 is supported by the walls 106 and may be removable to allow for servicing of the process chamber 100. The lid 110 may generally be comprised of aluminum and may additionally have heat transfer fluid channels 124 formed therein. The heat transfer fluid channels 124 are coupled to a fluid source (not shown) that flows a heat transfer fluid through the lid 110. Fluid flowing through the heat transfer fluid channels 124 regulates the temperature of the lid 110.

A showerhead 118 may generally be coupled to an interior side 120 of the lid 110. A perforated blocker plate 136 may optionally be disposed in the space 122 between the showerhead 118 and lid 110. Gases (i.e., process and other gases) that enter the process chamber 100 through the mixing block 134 are first diffused by the blocker plate 136 as the gases fill the space 122 behind the showerhead 118. The gases then pass through the showerhead 118 and into the process chamber 100. The blocker plate 136 and the showerhead 118 are configured to provide a uniform flow of gases to the process chamber 100. Uniform gas flow is desirable to promote uniform layer formation on the substrate 103.

Figure 2:
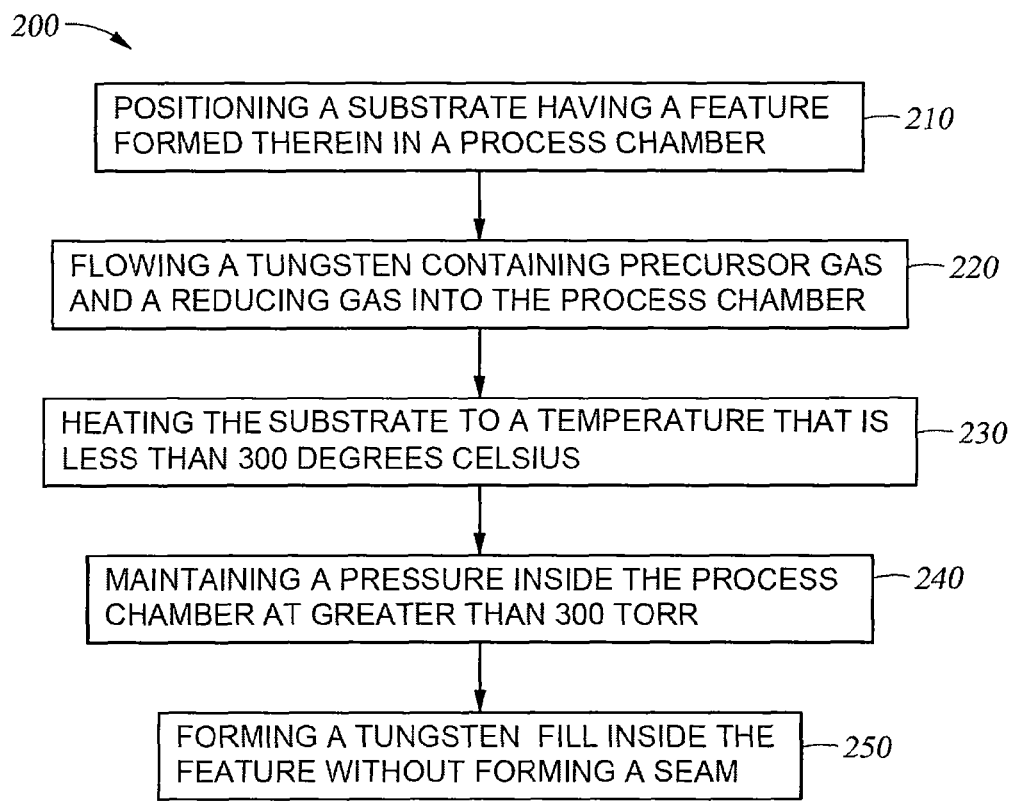
FIG. 2 is a flow diagram depicting a method 200 for depositing a tungsten fill layer according to one embodiment of the invention.
Figure 3A:
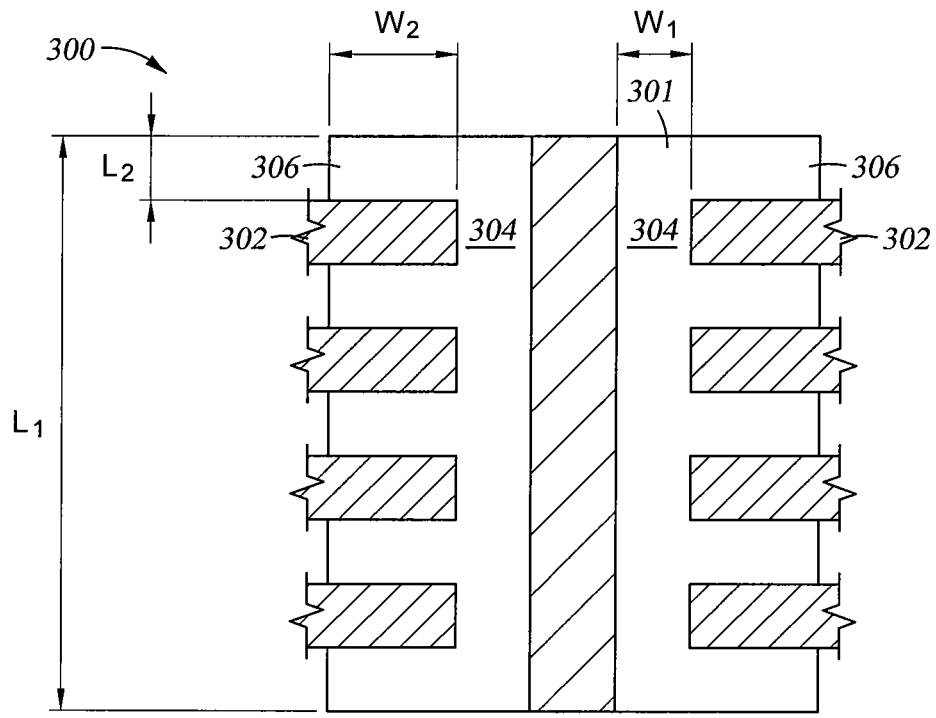
FIGS. 3A-3B are schematic cross sectional views of a substrate with a feature having tungsten deposited therein according to one embodiment of the invention.

FIG. 2 is a flow diagram depicting a method 200 for depositing a tungsten fill layer according to one embodiment of the invention. At block 210, a substrate having a feature formed therein is positioned in a process chamber. The process chamber may be the process chamber 100 described in FIG. 1. An example of such a substrate is shown in FIG. 3A. The substrate 300 shown in FIG. 3A may be a 3D structure having stack of layers 302 and a feature 301 that includes a main via 304 and side via 306. The stack of layers 302 may contain alternating layers of insulating, semiconducting, and metallic layers such as SiO$_2$, SiN, a-Si, and poly-Si. The main via 304 may have a width W1 ranging from about 200 angstroms to about 250 angstroms and a length L1 greater than 1.0 micrometer. The aspect ratio of the main via 304, as measured by dividing the length L1 over the width W1, may be between 40 and 100. In one embodiment, the aspect ratio of the main via 304 is about 50. The side via 306 may have a length L2 and a width W2, and both the length L2 and the width W2 may be between 200 angstroms and 250 angstroms. The feature 301 is not limited to the main via 304 and side via 306. Other examples of the feature 301 include trenches, lines, contact holes, or other features utilized in a semiconductor, solar, or other electronic devices, such as high aspect contact plugs.

The substrate 300 may previously have an adhesion layer formed conformally in the feature 301. The adhesion layer may be titanium nitride and may be deposited by an atomic layer deposition (ALD) process. The adhesion layer may have a thickness ranging from about 2 angstroms to about 100 angstroms, such as about 40 angstroms.

A nucleation layer may also be previously formed on the adhesion layer. The nucleation layer may be a thin layer of tungsten which acts as a growth site for subsequent film. The nucleation layer may be deposited by techniques such as ALD, conventional CVD, or pulsed CVD. This process may be performed in a CVD process chamber similar to that described above with reference to FIG. 1. The nucleation layer may comprise tungsten, tungsten alloys, tungsten-containing materials (e.g., tungsten boride or tungsten silicide), and combinations thereof. The nucleation layer may be deposited to a thickness in a range of about 10 angstroms to about 200 angstroms, or about 50 angstroms to about 150 angstroms. The nucleation layer may be deposited by flowing a tungsten containing gas (e.g., a tungsten halide compound such as WF$_6$) and a hydrogen containing gas (e.g., H$_2$, B$_2$H$_6$, or SiH$_4$) into a processing chamber, such as processing chamber 100 shown in FIG. 1.

In block 220, a tungsten containing precursor gas and a reducing gas are introduced into the process chamber. The tungsten containing precursor gas may be tungsten hexafluoride (WF$_6$) and may be introduced at a continuous flow rate in the range of about 100 sccm to 200 sccm. The reducing gas, preferably a hydrogen containing gas such as hydrogen gas (H$_2$), may be introduced at a continuous flow rate between 4,000 sccm and about 10,000 sccm. The ratio of the reducing gas flow rate to the tungsten containing precursor gas flow rate may be greater than 40 to 1, such as from 40 to 1 to 100 to 1, or from 60 to 1 to 80 to 1. Conventionally, the ratio is less than 20. With increased flow rate of the reducing gas, the tungsten deposition rate also increases at a temperature range from about 300 degrees Celsius to about 400 degrees Celsius. Again fast tungsten deposition rate in a feature having aspect ratio of greater than 50 may have the loading effect, which is inconsistent tungsten thickness between high density and low density pattern areas. To suppress the loading effect, the processing temperature may be lowered.

Figure 3B:
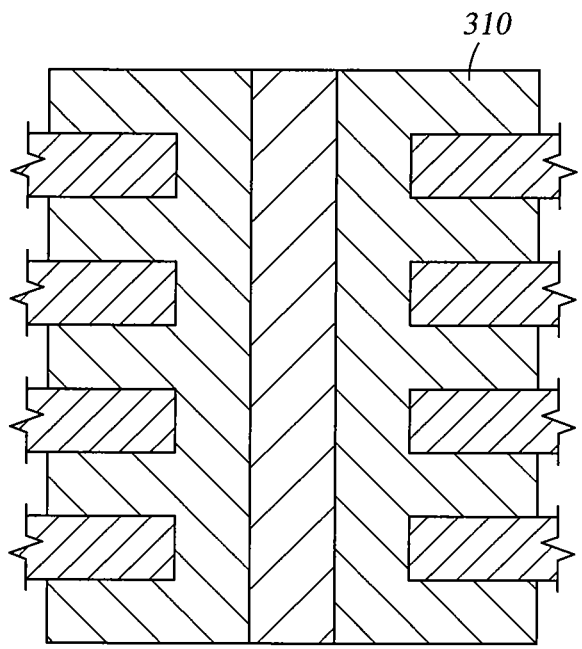

In block 230, the substrate is heated to a temperature that is less than 300 degrees Celsius, such as 250 degrees Celsius. At this reduced temperature, reaction rate is reduced, thus there is sufficient reactants across the substrate. As a result, the loading effect is almost completed suppressed. In addition, the high ratio of the reducing gas to the tungsten containing gas is still causing the reaction in the surface reaction limited region, providing good gap fill. In block 250, a tungsten gap fill is formed inside the feature without forming a seam. As shown in FIG. 3B, the tungsten gap fill 310 is formed in the feature 301. With low temperature and increased reducing gas flow, the tungsten gap fill 310 has an improved film roughness, leading to seamless tungsten gap fill. Furthermore, a high ratio of the reducing gas to the $WF_6$ gas may reduce fluorine attack on the gate material.

With reduced processing temperature, the tungsten deposition rate may reduce significantly. To help with the tungsten deposition rate, processing pressure may be increased from under 100 Torr to greater than 300 Torr. In block 240, the pressure of the process chamber during the CVD process is maintained at greater than 300 Torr, such as at 350 Torr. High processing pressure of greater than 300 Torr helps minimizing throughput reduction due to reduced temperature.

Figure 4:
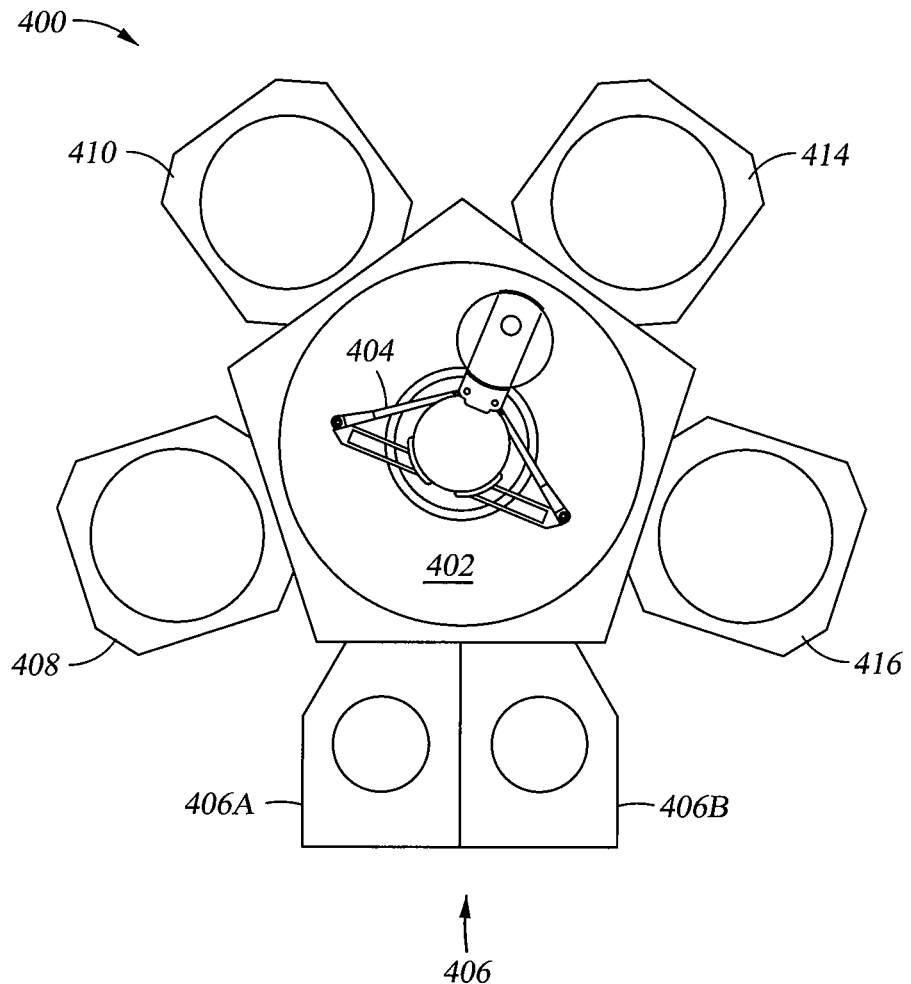
FIG. 4 is a schematic plan view of a cluster tool that may be used for performing the methods described herein.

The method 200 described above may be performed in the process chamber 100, which may be part of a processing system 400 shown in FIG. 4. FIG. 4 is a schematic plan view of a processing system 400 that may be used for performing the methods described herein. An example of the processing system 400 is the CENTURA® system available from Applied Materials, Inc., of Santa Clara, Calif. Processing systems manufactured by others may be used as well. Processing system 400 generally includes a transfer chamber 402 coupled to load lock chambers 406A and 406B for the transfer of substrates into and out from processing system 400. A robot 404 disposed in the transfer chamber 402 may transfer the substrates between load lock chambers 406A, 406B, and a set of one or more substrate processing chambers 408, 410, 414 and 416 (four are shown). Each processing chamber 408, 410, 414 and 416 may be outfitted to perform a number of substrate processing operations such as ALD, CVD, PVD, etch, pre-clean, de-gas, orientation, or other substrate processes.

In one embodiment, the processing chamber 410 may be an ALD chamber or other vapor deposition chamber adapted to deposit sequential layers containing different chemical compound. For example, the sequential layers may include a layer, an adhesion layer, and a nucleation layer. Processing chamber 414 may be an ALD chamber, a CVD chamber, or a PVD adapted to form a bulk layer. In one embodiment, processing chamber 414 is the processing chamber 100 that is used to perform method 200. This one particular arrangement of processing system 400 is provided to illustrate some implementations of the invention and should not be used to limit the scope of other implementations of the invention.

In summary, a method of forming tungsten film inside a feature having high aspect ratio is disclosed. The tungsten film is formed by thermal CVD at a reduced substrate temperature of less than 300 degrees Celsius and an increased pressure of greater than 300 Torr. The flow ratio of the reducing gas to tungsten containing gas is also increased. As a result, a high aspect ratio feature, such as a via in a 3D NAND structure, may have a seamless tungsten gap fill, and fluorine attack on the gate material is reduced.

While the foregoing is directed to embodiments of the present invention, other and further embodiments of the invention may be devised without departing from the basic scope thereof, and the scope thereof is determined by the claims that follow.

The invention claimed is:

1. A method for depositing a tungsten film on a substrate, comprising:
    positioning a substrate in a substrate process chamber, wherein the substrate has a feature formed therein; and
    depositing the tungsten film inside the feature without forming a seam by:
        flowing a reducing gas and a tungsten containing gas into the process chamber, wherein a flow ratio of the reducing gas to the tungsten containing gas is greater than 40 to 1;
        heating the substrate to a temperature that is less than 300 degrees Celsius; and
        maintaining a processing pressure of greater than 300 Torr during the depositing of the tungsten film.

2. The method of claim 1, wherein the tungsten film is deposited by a thermal chemical vapor deposition process.

3. The method of claim 2, wherein the substrate is heated to 250 degrees Celsius.

4. The method of claim 1, wherein the processing pressure is about 350 Torr.

5. The method of claim 1, wherein the reducing gas comprises hydrogen gas.

6. The method of claim 1, wherein the tungsten containing gas comprises tungsten hexafluoride.

7. The method of claim 1, wherein the feature has an aspect ratio of at least 40.

8. The method of claim 1, wherein the flow ratio of the reducing gas to the tungsten containing gas is from 60 to 1 to 80 to 1.

9. A method for depositing a tungsten film on a substrate, comprising:
    positioning a substrate in a substrate process chamber, wherein the substrate has a feature formed therein; and
    depositing the tungsten film inside the feature without forming a seam by:
        flowing a hydrogen gas and a tungsten hexafluoride gas into the process chamber, wherein a flow ratio of the reducing gas to the tungsten containing gas is greater than 40 to 1;
        heating the substrate to a temperature that is less than 300 degrees Celsius; and
        maintaining a processing pressure of greater than 300 Torr during the depositing of the tungsten film.

10. The method of claim 9, wherein the tungsten film is deposited by a thermal chemical vapor deposition process.

11. The method of claim 10, wherein the substrate is heated to 250 degrees Celsius.

12. The method of claim 9, wherein the processing pressure is about 350 Torr.

13. The method of claim 9, wherein the feature has an aspect ratio of at least 40.

14. The method of claim 9, wherein the flow ratio of the reducing gas to the tungsten containing gas is from 60 to 1 to 80 to 1.

15. The method of claim 9, wherein the substrate is heated to 250 degrees Celsius.

\* \* \* \* \*